United States Patent
Arahara

(10) Patent No.: US 10,859,927 B2
(45) Date of Patent: Dec. 8, 2020

(54) CALCULATION METHOD, EXPOSURE METHOD, STORAGE MEDIUM, EXPOSURE APPARATUS, AND METHOD OF MANUFACTURING ARTICLE

(71) Applicant: CANON KABUSHIKI KAISHA, Tokyo (JP)

(72) Inventor: Koshiro Arahara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 46 days.

(21) Appl. No.: 16/131,120

(22) Filed: Sep. 14, 2018

(65) Prior Publication Data

US 2019/0086822 A1    Mar. 21, 2019

(30) Foreign Application Priority Data

Sep. 21, 2017 (JP) ................. 2017-181472

(51) Int. Cl.
*G03F 7/20*    (2006.01)
*G01B 11/25*    (2006.01)

(52) U.S. Cl.
CPC ...... *G03F 7/70891* (2013.01); *G01B 11/2522* (2013.01); *G03F 7/20* (2013.01); *G03F 7/706* (2013.01); *G03F 7/70241* (2013.01); *G03F 7/70258* (2013.01)

(58) Field of Classification Search
CPC ........ G03F 7/70891; G03F 7/20; G03F 7/706; G03F 7/70241; G01B 11/2522
See application file for complete search history.

(56) References Cited

U.S. PATENT DOCUMENTS

| | | | |
|---|---|---|---|
| 4,801,977 A | 1/1989 | Ishizaka et al. | |
| 5,883,704 A * | 3/1999 | Nishi | G03B 27/26 355/30 |
| 6,333,777 B1 * | 12/2001 | Sato | G03F 7/70066 355/53 |
| 6,522,386 B1 * | 2/2003 | Nishi | G03F 7/70241 355/52 |
| 6,765,647 B1 * | 7/2004 | Nishi | G03F 7/70808 250/492.2 |
| 6,768,546 B2 * | 7/2004 | Sato | G03F 7/701 355/53 |
| 7,385,672 B2 * | 6/2008 | Shinoda | G03F 7/70108 355/53 |

(Continued)

FOREIGN PATENT DOCUMENTS

| JP | S63058349 A | 3/1988 |
|---|---|---|
| JP | 2001160533 A | 6/2001 |

*Primary Examiner* — Sang H Nguyen
(74) *Attorney, Agent, or Firm* — Rossi, Kimms & McDowell LLP

(57) ABSTRACT

The present invention provides a calculation method of calculating optical characteristics of a projection optical system that change due to heat during exposure of a substrate, the method comprising measuring image point positions at different measurement times for a plurality of measurement points on an object plane of the projection optical system; and calculating the optical characteristics based on the image point position measured in the measuring for each of the plurality of measurement points and measurement time for each of the plurality of measurement points.

14 Claims, 6 Drawing Sheets

(56) References Cited

U.S. PATENT DOCUMENTS

| | | | | |
|---|---|---|---|---|
| 2003/0227607 A1* | 12/2003 | Kato | ............... | G03F 7/70575 |
| | | | | 355/53 |
| 2004/0179177 A1* | 9/2004 | Ohsaki | ............. | G03F 9/7026 |
| | | | | 355/53 |
| 2005/0190350 A1* | 9/2005 | Shinoda | .......... | G03F 7/70108 |
| | | | | 355/53 |
| 2007/0296945 A1* | 12/2007 | Miura | ............... | G03B 27/54 |
| | | | | 355/67 |
| 2013/0342819 A1* | 12/2013 | Takeshita | ........ | G03F 7/70616 |
| | | | | 355/67 |
| 2016/0124318 A1* | 5/2016 | Yabu | ............... | G03F 7/70091 |
| | | | | 430/30 |
| 2017/0045825 A1* | 2/2017 | Hoshino | .......... | G03F 7/7085 |
| 2017/0052457 A1* | 2/2017 | Arahara | .............. | G03F 7/20 |

\* cited by examiner

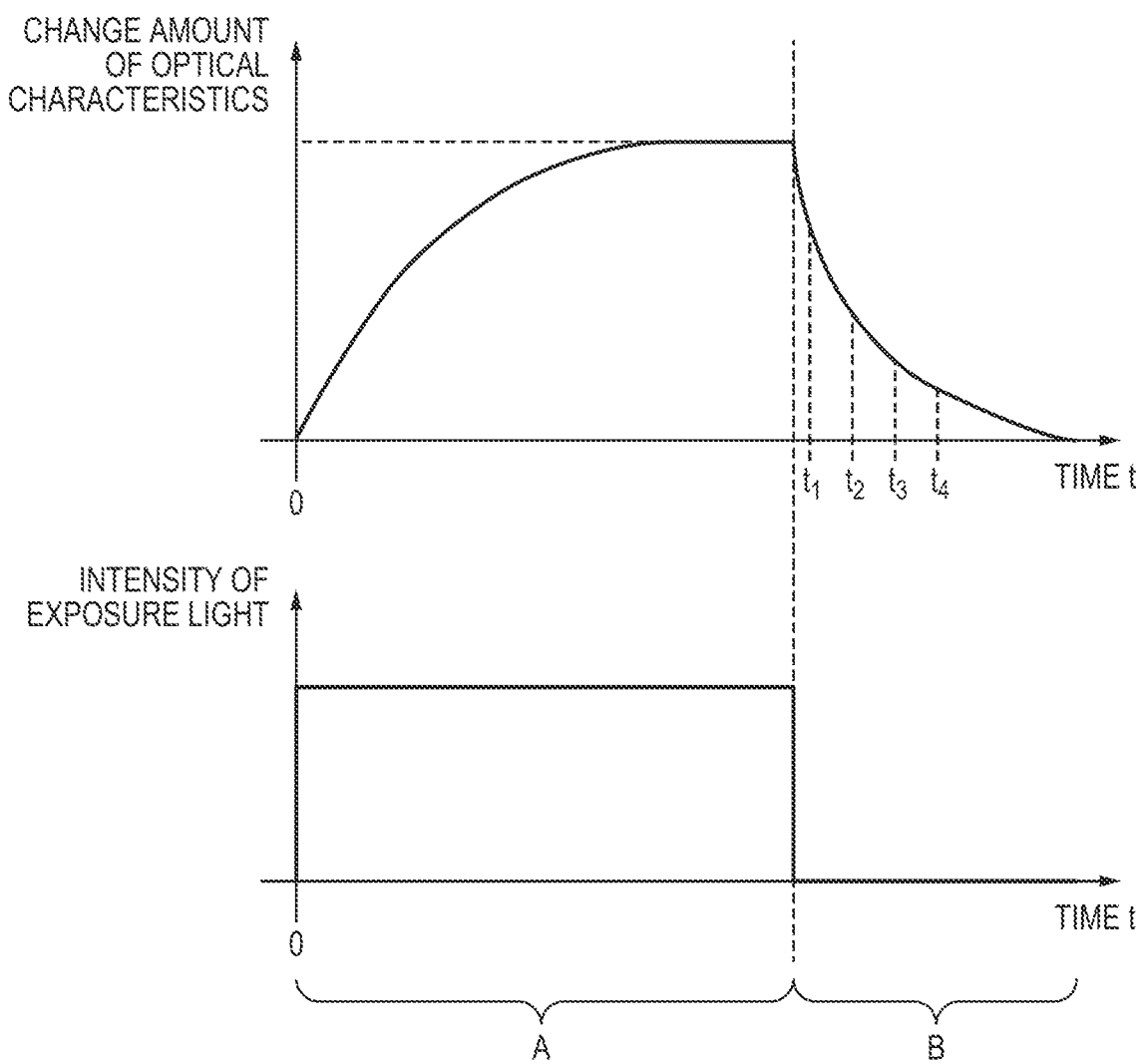

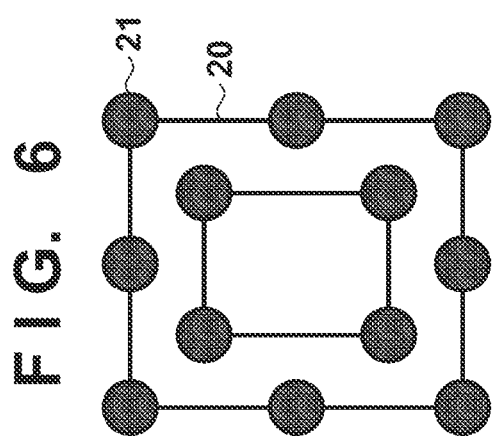
FIG. 6
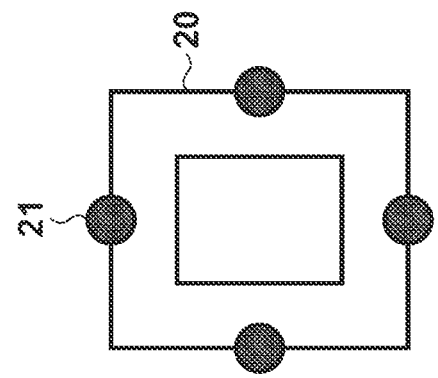
FIG. 7C
FIG. 7B
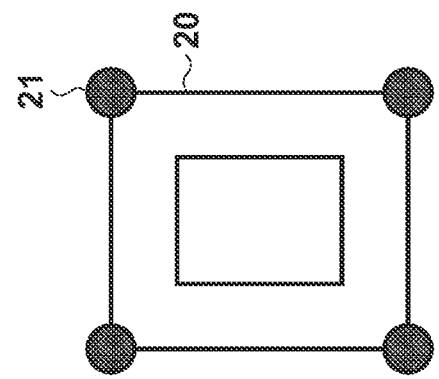
FIG. 7A

CALCULATION METHOD, EXPOSURE METHOD, STORAGE MEDIUM, EXPOSURE APPARATUS, AND METHOD OF MANUFACTURING ARTICLE

BACKGROUND OF THE INVENTION

Field of the Invention

The present invention relates to a calculation method of calculating optical characteristics of a projection optical system, an exposure method, a storage medium, an exposure apparatus, and a method of manufacturing an article.

Description of the Related Art

One of the apparatuses used in the manufacturing step (lithography step) of semiconductor devices and the like is an exposure apparatus which exposes a substrate via a projection optical system and transfers a pattern of an original to a shot region on the substrate. In such an exposure apparatus, during exposure of the substrate, a part of exposure light is absorbed in the projection optical system, and thus optical characteristics of the projection optical system change under the influence of heat generated by the absorption. As a result, it may become difficult to transfer the pattern of the original to the shot region accurately.

Japanese Patent Laid-Open No. 2001-160533 proposes a method of predicting optical characteristics of a projection optical system by using a prediction formula having an exposure amount, an exposure time, and the like as variables and controlling the optical characteristics of the projection optical system based on a predicted value. Japanese Patent Laid-Open No. 63-58349 proposes a method of optimizing (correcting) a prediction formula based on a result of actually measuring optical characteristics of a projection optical system so as to reduce errors generated in a predicted value.

Actual measurement of optical characteristics of a projection optical system to optimize a prediction formula can be performed by sequentially measuring an image point position for each of a plurality of measurement points (object points) on an object plane of the projection optical system in a period when the optical characteristics change, for example, after the end of substrate exposure. In this case, however, measurement at the respective measurement points is performed at timings different in optical characteristics of the projection optical system. Therefore, optimization of the prediction formula may be insufficient unless the optical characteristics of the projection optical system which are different in accordance with measurement timings at the respective measurement points are considered, making it difficult to predict the optical characteristics of the projection optical system accurately.

SUMMARY OF THE INVENTION

The present invention provides, for example, a technique advantageous in predicting optical performance of a projection optical system accurately.

According to one aspect of the present invention, there is provided a calculation method of calculating optical characteristics of a projection optical system that change due to heat during exposure of a substrate, the method comprising: measuring image point positions at different measurement times for a plurality of measurement points on an object plane of the projection optical system; and calculating the optical characteristics based on the image point position measured in the measuring for each of the plurality of measurement points and measurement time for each of the plurality of measurement points.

Further features of the present invention will become apparent from the following description of exemplary embodiments with reference to the attached drawings.

BRIEF DESCRIPTION OF THE DRAWINGS

FIG. 2 shows a graph of the relationship between an exposure time and a change amount of optical characteristics, and a graph of the relationship between an intensity of exposure light and the exposure time;

FIG. 6 is a view showing an example of the arrangement of a plurality of measurement points;

FIG. 7A is a view showing an example of measurement points distributed to the first group;

FIG. 7B is a view showing an example of measurement points distributed to the second group;

FIG. 7C is a view showing an example of measurement points distributed to the third group;

DESCRIPTION OF THE EMBODIMENTS

Figure 1A:
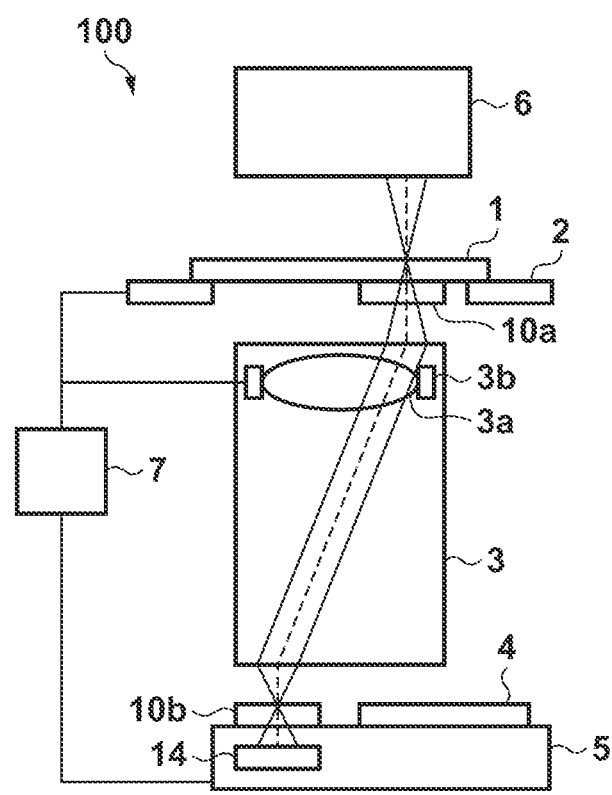
FIG. 1A is a schematic view showing an exposure apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An exposure apparatus 100 according to the first embodiment of the present invention will be described with reference to FIG. 1A. FIG. 1A is a schematic view showing the exposure apparatus 100 according to the first embodiment. The exposure apparatus 100 can include, for example, an original stage 2 which holds an original 1 (mask), a projection optical system 3, a substrate stage 5 that can move while holding a substrate 4, an illumination optical system 6, and a controller 7. The controller 7 includes, for example, a CPU and a memory, and controls an exposure process of transferring a pattern of the original 1 to a shot region on the substrate 4 (controls the respective units of the exposure apparatus 100).

The illumination optical system 6 shapes light emitted from a light source (not shown) by using a light-shielding member such as a masking blade included in the system and illuminates a pattern region (a region including a circuit pattern) of the original 1 with the shaped light. The original 1 and the substrate 4 can be held by the original stage 2 and the substrate stage 5, respectively, and located at optically almost conjugate positions (object plane and image plane of the projection optical system 3) via the projection optical system 3. The projection optical system 3 projects the pattern of the original 1 onto the substrate 4 (shot region).

In the exposure apparatus 100 thus configured, a part of exposure light is absorbed in the projection optical system 3, and thus optical characteristics (for example, an optical aberration such as a distortion) of the projection optical system 3 may change over an exposure time under the influence of heat generated by the absorption. For example, the optical characteristics of the projection optical system 3 can exponentially change with respect to the exposure time as shown in the upper graph of FIG. 2 when an exposure process is performed with the exposure light having a predetermined intensity as shown in the lower graph of FIG. 2. It may thus become difficult in the exposure apparatus 100 to transfer the pattern of the original 1 to shot region accurately unless such a change amount of the optical characteristics of the projection optical system 3 is considered.

In the exposure apparatus 100, the optical characteristics of the projection optical system 3 that change due to heat during exposure of the substrate 4 are predicted, and the exposure process is performed while changing (correcting) the optical characteristics of the projection optical system 3 based on that predicted value. A change unit (correction unit) can change the optical characteristics of the projection optical system 3. The change unit can include, for example, at least one of a driving unit 3b which drives an optical element 3a of the projection optical system 3 and the substrate stage 5. In this embodiment, an example will be described in which the driving unit 3b is used as the change unit and is controlled by the controller 7 based on the predicted value of the optical characteristics of the projection optical system 3. The driving unit 3b shown in FIG. 1A is configured to drive one optical element 3a. However, the present invention is not limited to this. The driving unit 3b may be configured to drive a plurality of optical elements.

A prediction method of predicting the optical characteristics of the projection optical system 3 will be described below in this embodiment while comparing it with a conventional prediction method. An example will be described below in which the controller 7 performs a process of predicting the optical characteristics of the projection optical system 3 (a process of determining prediction formulas). However, a processor that performs the process may be provided independently of the controller 7.

[Conventional Prediction Method]

First, the conventional prediction method of the optical characteristics of the projection optical system 3 will be described. Conventionally, a predicted value $\Phi_k$ for the optical characteristics of the projection optical system 3 can be obtained by, for example, a prediction formula given by:

$$\Phi = Ic \cdot E_k - (Ic \cdot E_k - \Phi_{k-1}) \exp(-t_k/K) \quad (1)$$

where $E_k$ represents an exposure amount an amount of light transmitted through the projection optical system), $t_k$ represents an exposure time, $I_c$ represents a coefficient for making the predicted value closer to an actually measured value (a coefficient for correcting an error in the predicted value), and K represents a time constant related to heat conduction of the projection optical system 3.

Errors with respect to the actually measured value may be generated in the predicted value $\Phi_k$ obtained by the prediction formula. If such errors are generated in the predicted value $\Phi_k$, it may become difficult to transfer the pattern of the original 1 to the shot region on the substrate 4 accurately even if the change unit (driving unit 3b) is driven in accordance with the predicted value $\Phi_k$. Therefore, in the exposure apparatus, for example, in a period (a period B in FIG. 2) when the change amount of the optical characteristics of the projection optical system generated in an exposure step (a period A in FIG. 2) decreases after the exposure step, the optical characteristics of the projection optical system 3 are actually measured, and optimization of the prediction formula is performed based on that actual measurement result.

In formula (1), the coefficient Ic and the time constant K are parameters determined in order to optimize the prediction formula (to be sometimes referred to as correction parameters hereinafter). These correction parameters can be determined for each type of optical characteristics (for example, the projection magnification, focus, distortion, and the like) of the projection optical system 3. Moreover, in the exposure apparatus, a fluctuation in optical characteristics of the projection optical system 3 changes depending on exposure conditions such as illumination NA, illumination σ, an exposure angle of view, reticle transmittance, the reflectance of light in the substrate, and the like. It is therefore preferable that the correction parameters are determined (optimized) for each exposure condition and stored in a memory or the like.

A method of optimizing a prediction formula (correction parameters) will be described next. In order to optimize the prediction formula, measurement (actual measurement) of the optical characteristics of the projection optical system 3 can be performed. As a method of measuring the optical characteristics, there are, for example, a method of using a test print (baking) and a method of using an aerial image. The former method of using the test print is a method of obtaining the optical characteristics by transferring the pattern of the original 1 to a test substrate and measuring the position or critical dimension (CD) of the pattern transferred to the test substrate after the test substrate is developed. On the other hand, the latter method of using the aerial image is a method of detecting (observing) an aerial image formed by the projection optical system 3 and measuring the optical characteristics from that detection result. As compared with the method of using the test print, the latter method of using the aerial image does not include a step of developing the substrate, making it possible to largely shorten a time required to measure the optical characteristics of the projection optical system 3. A detailed example in which the optical characteristics (for example, the distortion) of the projection optical system 3 are measured by using the aerial image will be described below.

Figure 1B:
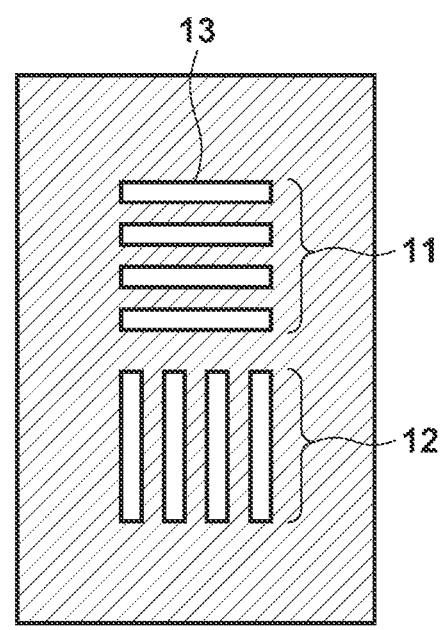
FIG. 1B is a view showing an example of the arrangement of measurement patterns.

As shown in FIG. 1A, the exposure apparatus 100 includes measurement patterns 10, respectively, on an object plane side (original side) and image plane side (substrate side) of the projection optical system 3. A measurement pattern 10a on the original side and a measurement pattern 10b on the substrate side can have the same arrangement, and include an H pattern 11 and a V pattern 12, respectively, as shown in FIG. 1B. The H pattern 11 can include a line and space pattern in which a plurality of light-transmissive portions 13 that serve as line elements extending in an X direction are arranged in a Y direction, and be used to detect an image point position of the projection optical system 3 in the Y direction. On the other hand, the V pattern 12 includes a line and space pattern in which the plurality of light-transmissive portions 13 that serve as line elements extending in the Y direction are arranged in the X direction, and is used to detect an image point position of the projection optical system 3 in the X direction.

The measurement pattern 10a on the original side and the measurement pattern 10b on the substrate side are, respectively, provided on the original stage 2 and the substrate stage 5, and movable in an optical axis direction (Z direction) of the projection optical system 3 and an in-plane direction (the X direction or the Y direction) perpendicular to the optical axis. The substrate stage 5 can also include, below the measurement pattern 10b on the substrate side, a light amount sensor 14 (measurement unit) that detects the amount (intensity) of light transmitted through the light-transmissive portions 13 of the measurement pattern 10b and measures the image point position of the measurement pattern 10a on the original side.

The exposure apparatus 100 moves (scans) the substrate stage 5 such that light emitted from the illumination optical system 6 is transmitted through the light-transmissive portions 13 of the measurement pattern 10a on the original side and the light-transmissive portions 13 of the measurement pattern 10b on the substrate side, and the amount of the light detected by the light amount sensor 14 is maximized. For example, for the H pattern 11, the light amount sensor 14 is caused to detect the light amount while moving the substrate stage 5 in a direction (Y direction) perpendicular to a longitudinal direction of the line elements (light-transmissive portions 13). Then, a position (coordinates) at which the light amount detected by the light amount sensor 14 is maximized, that is, a position at which an image of the measurement pattern 10a on the original side and an image of the measurement pattern 10b on the substrate side overlap the most in the Y direction is determined as an image point position (imaging position) in the Y direction. The same also applies to the V pattern 12. The light amount sensor 14 is caused to detect the light amount while moving the substrate stage 5 in the X direction, and the position at which the detected light amount is maximized is determined as an image point position (imaging position) in the X direction.

Such measurement of the image point positions is performed while causing the original stage 2 to arrange the measurement pattern 10a on the original side sequentially at each of a plurality of measurement points (object points) preset on the object plane (the projection region and the angle of view) of the projection optical system 3. Consequently, for each measurement point, a difference in the X and Y directions between the image point position of the measurement pattern 10a on the original side measured by the light amount sensor 14 and a target position (an ideal position or a design position) at which the image point of the measurement pattern 10a on the original side is to be measured is obtained. The difference will sometimes be referred to as a "deviation amount at an image point position" hereinafter.

Conventionally, deviation amounts dx and dy at an image point position are given by:

$$dx_i = Ic_{Mag} \cdot x_i$$

$$dy_i = Ic_{Mag} \cdot y_i \qquad (2)$$

where "$x_i$" and "$y_i$" represent coordinates at the target position in the X and Y directions, "i" represents a number of a measurement point, and "$Ic_{mag}$" represents the coefficient Ic for a space change component (magnification change) in the distortion of the projection optical system. It is possible to optimize the prediction formula (correction parameters) by obtaining the coefficient $Ic_{mag}$ such that the deviation amounts dx and dy at the image point position are minimized by using the least square method or the like. Note that a plurality of measurement points may be set, for example, so as to include four corners of the exposure angle of view.

[Prediction Method of this Embodiment]

Measurement of an image point position at each measurement point is performed in a state in which at least the measurement pattern 10a on the original side is illuminated by the illumination optical system 6 (light-shielding member) after the end of the exposure process, and the amount of light transmitted through the projection optical system 3 is much smaller than that during exposure of the substrate. That is, measurement of the image point position is performed in a state in which the exposure amount $E_k$ is close to "zero". Accordingly, in a period in which the measurement is performed, heat is hardly generated in the projection optical system 3, and the change amount of the optical characteristics of the projection optical system caused by the exposure process decreases exponentially.

A speed at which the optical characteristics of the projection optical system 3 change depends on the time constant K in formula (I). If this time constant K is sufficiently longer than a time required to measure the image point position at each of the plurality of measurement points, it is possible to regard the optical characteristics of the projection optical system 3 at a measurement timing for each measurement point as constant. In this case, it is possible to optimize the prediction formula (correction parameters) sufficiently by using the above-described conventional method.

However, the time constant K is a unique value determined by, for example, the arrangement of the projection optical system 3. Depending on the time constant K, the optical characteristics of the projection optical system 3 may change to a non-negligible degree while the image point position is measured at each of the plurality of measurement points. For example, in a case in which several sec to ten several sec is required to measure the image point position at one measurement point, a total time becomes several tens of sec by measuring image point positions at ten measurement points. In contrast, the time constant K of the projection optical system 3 generally falls within the range of several tens of sec to several thousand sec and becomes almost equal to the total time required to measure the image point positions in the projection optical system 3 whose time constant K is several tens of sec. It is not preferable to ignore a change speed of the optical characteristics of the projection optical system 3. That is, optimization of the prediction formula (correction parameters) may be insufficient unless the optical characteristics of the projection optical system 3 at the measurement timing of the image point position at each measurement point are considered.

The detailed example will be described with reference to FIGS. 3A to 3D and FIG. 4. As shown in FIGS. 3A to 3D, a time Δt is required to measure an image point position at one measurement point assuming a case in which measurement of image point positions is performed sequentially at four measurement points (respective apexes of the angle of view) after the exposure step. Each of FIGS. 3A to 3D is a conceptual view showing a change in optical characteristics (distortion) of the projection optical system 3. Each broken line indicates a projection region 20a before the optical characteristics of the projection optical system 3 change (time t=0 in FIG. 2), and each solid line indicates a projection region 20b at a measurement timing at each measurement point.

Figure 3A:
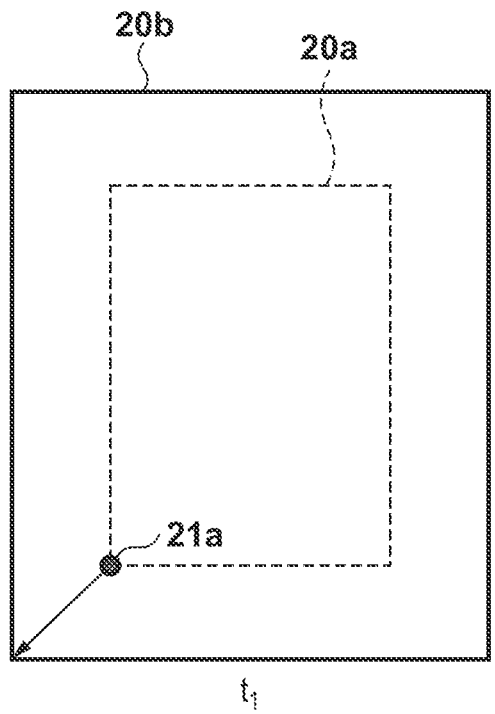
FIG. 3A is a view showing a projection region at a measurement timing of the first measurement point.
Figure 3B:
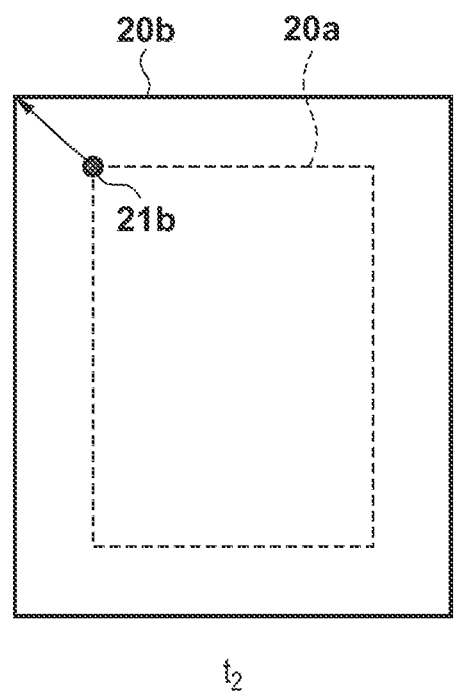
FIG. 3B is a view showing a projection region at a measurement timing of the second measurement point.
Figure 3C:
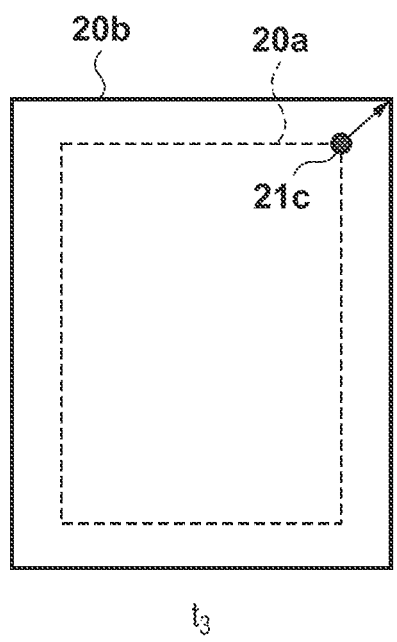
FIG. 3C is a view showing a projection region at a measurement timing of the third measurement point.
Figure 3D:
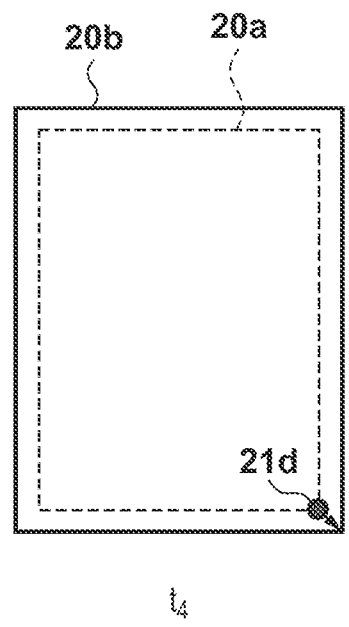
FIG. 3D is a view showing a projection region at a measurement timing of the fourth measurement point.
Figure 4:
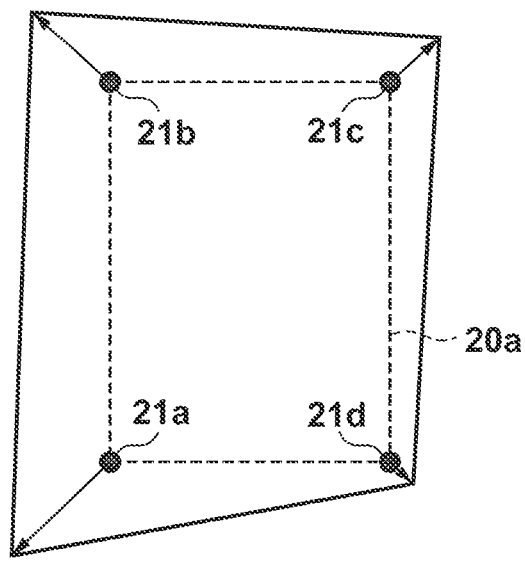
FIG. 4 is a view showing a measurement result in a case in which measurement of image point positions at the respective measurement points is performed at different measurement timings.

Measurement of an image point position at a first measurement point 21a is performed at time $t_1$ when the projection region 20b is comparatively large as shown in FIG. 3A. In this case, measurement of an image position at a second measurement point 21b is performed at time $t_2$ (=$t_1$+Δt) when the projection region 20b becomes smaller than that at the time $t_1$ as shown in FIG. 3B. Additionally, measurement of an image point position at a third measurement point 21c is performed at time $t_3$ (=$t_1$+2Δt) when the projection region 20b becomes smaller than that at the time $t_2$ as shown in FIG. 3C. Similarly, measurement of an image point position at a fourth measurement point 21d is performed at time $t_4$ (=$t_1$+3Δt) when the projection region 20b becomes smaller than that at the time $t_3$ as shown in FIG. 3D. If measurement of the image point positions at the respective measurement points is thus performed at different measurement timings, change amounts (absolute values of change vectors) in the projection regions at the respective measurement timings may be different as shown in FIG. 4. Therefore, if optimization of the prediction formula is performed by using a measurement result of the image point position directly without considering the optical characteristics of the projection optical system 3 at each measurement timing as in the conventional method, the optimization may be insufficient.

Figure 5:
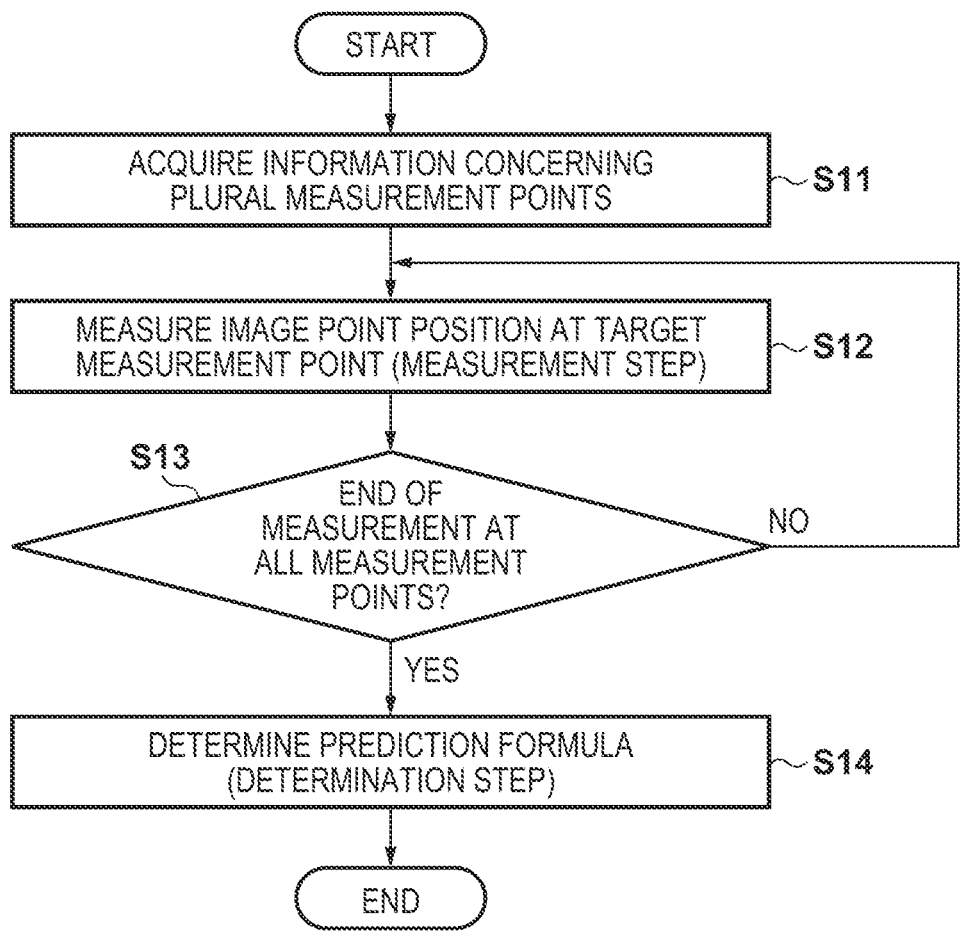
FIG. 5 is a flowchart showing a determination method for a prediction formula.

To prevent this, the exposure apparatus 100 of this embodiment considers the change amount of the optical characteristics at the measurement timing for each measurement point when determining the prediction formula (correction parameter (coefficient Ic)) based on the image point position measured for each of the plurality of measurement points. A determination method for the prediction formula according to this embodiment will be described below with reference to FIG. 5. FIG. 5 is a flowchart showing the determination method for a prediction formula according to this embodiment. Each step of the flowchart can be performed by the controller 7. In this embodiment, a determination method for a prediction formula that predicts a magnification component serving as the first-order component of the distortion in the projection optical system 3 as the optical characteristics of the projection optical system 3 will be described.

In step S11, the controller 7 acquires information concerning a plurality of measurement points set on the object plane of the projection optical system 3. In this embodiment, an example will be described in which the controller 7 acquires information concerning a plurality of measurement points preset by an external computer or the like. However, for example, the controller 7 itself may set a plurality of measurement points.

In step S12, the controller 7 measures an image point position at one measurement point (to be referred to as a target measurement point hereinafter) out of the plurality of measurement points (measurement step). As described above, measurement of the image point position is performed by arranging the measurement pattern 10a on the original side at the target measurement point by the original stage 2 and searching for an image point position at the target measurement point while scanning the light amount sensor 14 by the substrate stage 5. The image point position measured at the target measurement position is stored in a memory or the like together with a measurement timing at the target measurement point. In step S13, the controller 7 determines whether image point positions are measured for all the plurality of measurement points. If there is even one measurement point at which measurement of the image point position is not performed, the process returns to step S12 to perform measurement of the image point position by changing the target measurement point. On the other hand, if the image point positions are measured for all the plurality of measurement points, the process advances to step S14.

In step S14, the controller 7 determines the prediction formula (coefficient $Ic_{Mag}$) (determination step) based on the image point position measured at each measurement position in step S12 and an estimated value of the optical characteristics (change amount) of the projection optical system 3 at the measurement timing for each measurement point. That is, in a measurement step in step S14, the prediction formula is determined in consideration of the optical characteristics of the projection optical system 3 at the measurement timing for each measurement point with respect to the image point position measured at each measurement point.

The determination step in step S14 will be described here in detail. For example, the controller 7 obtains a difference in the X and Y directions between the target position and the image point position measured at the target measurement point (deviation amounts of the image point position) in step S14. Then, letting ($x_i$, $y_i$) be a target measurement position of a target measurement point measured at time $t_1$ in the X and Y directions, a deviation amount $dx(x_i, y_i, t_i)$ of the image point position in the X direction and a deviation amount $dy(x_i, y_i, t_i)$ in the Y direction are, respectively, given by:

$$dx(x_i,y_i,t_i)=Ic_{Mag} \cdot x_i \phi_{Mag}(t_i)$$

$$dy(x_i,y_i,t_i)=Ic_{Mag} \cdot y_i \phi_{Mag}(t_i) \quad (3)$$

As compared with conventional formulas (2) described above, a function $\phi_{Mag}(t_i)$ is multiplied in these formulas (3). The function $\phi_{mag}(t_i)$ is given by:

$$\phi_{Mag} = E \cdot \left(1 - \exp\left(-\frac{t}{K}\right)\right) + \phi_{k-1} \exp\left(-\frac{t}{K}\right) \quad (4)$$

where E is an exposure amount, and K is the time constant of the projection optical system. The function $\phi_{Mag}(t_i)$ is a function for estimating (calculating) the optical characteristics of the projection optical system based on time and the exposure amount (the amount of light transmitted through the projection optical system 3) of the substrate, and is normalized without including the coefficient $Ic_{Mag}$ serving as an unknown parameter. That is, formulas (3) calculate the deviation amounts at the image point position by using, as parameters, the estimated value of the optical characteristics of the projection optical system at the measurement timing for each measurement point and the target position of an image point.

By using the least square method or the like, the controller 7 obtains a coefficient $Ic_{Max}$ such that the square sum of differences between a deviation amount of an actually measured image point position, and the deviation amounts $dx(x_i, y_i, t_i)$ and $dy(x_i, y_i, t_i)$ of the image point position for each measurement point represented by formulas (3) is minimized. This makes it possible to accurately determine a prediction formula for predicting a change in optical characteristics of the projection optical system 3. For example, a prediction formula for predicting a change in magnification component (the first-order component of the distortion) serving as the optical characteristics of the projection optical system 3 can be given by "Mag(t)" representing a projection magnification of the projection optical system 3 with respect to the time t:

$$Mag(t) = Ic_{Mag} \cdot \phi_{Mag} = Ic_{Mag} \cdot E \cdot \left(1 - \exp\left(-\frac{t}{K}\right)\right) + \phi_{k-1} \exp\left(-\frac{t}{K}\right) \quad (5)$$

As described above, in this embodiment, a prediction formula is determined based on an image point position measured for each of the plurality of measurement points and an estimated value of the optical characteristics of the projection optical system 3 at a measurement timing. By using the prediction formula thus determined, it is possible to accurately predict the optical characteristics of the projection optical system 3 during exposure of the substrate. In this embodiment, the example in which the controller 7 of the exposure apparatus 100 determines the prediction formulas has been described. However, the present invention is not limited to this, and a processor such as an external computer provided outside the exposure apparatus 100 may determine the prediction formulas.

Second Embodiment

In the first embodiment, the determination method for the prediction formula that predicts the first-order component (magnification component) of the distortion as the optical characteristics of the projection optical system 3 has been described. In the second embodiment, a determination method for a prediction formula that predicts a higher-order distortion component than in the first embodiment will be described. In the second embodiment, a determination method for prediction formulas that predict the first-order distortion symmetrical component, the third-order distortion symmetrical component, and an XY difference component of the first-order distortion will be described based on a flowchart shown in FIG. 5.

In step S11, a controller 7 acquires information concerning a plurality of measurement points (object points) set on an object plane of a projection optical system 3. In this embodiment, since the higher-order distortion component is also measured as compared with the first embodiment, the number of set measurement points is larger than in the first embodiment (see, for example, FIGS. 3A to 3D). FIG. 6 is a view showing an example of the arrangement of a plurality of measurement points set on an object plane according to this embodiment. In the example shown in FIG. 6, twelve measurement points 21 are set on a projection region 20 (angle of view) of the projection optical system 3.

In steps S12 and S13, the controller 7 measures an image point position for each of the plurality of measurement points. Then, in step S14, the controller 7 determines a prediction formula in consideration of the optical characteristics of the projection optical system 3 at a measurement timing for each measurement point with respect to the image point position measured at each measurement point.

In this embodiment, letting $(x_i, y_i)$ be a target position of a target measurement point measured at time t in X and Y directions, a deviation amount $dx(x_i, y_i, t_i)$ of an image point position in the X direction and a deviation amount $dy(x_i, y_i, t_i)$ in the Y direction are given by:

$$dx(x_i,y_i,t_i) = Ic_{1st} \cdot x_i \phi_{1st}(t_i) + Ic_{3rd} \cdot x_i r_i^2 \phi_{3rd}(t_i) + Ic_{1stXY} \cdot x_i \phi_{1stXY}(t_i)$$

$$dy(x_i,y_i,t_i) = Ic_{1st} \cdot y_i \phi_{1st}(t_i) + Ic_{3rd} \cdot y_i r_i^2 \phi_{3rd}(t_i) + Ic_{1stXY} \cdot y_i \phi_{1stXY}(t_i)$$

$$r_i^2 = x_i^2 + y_i^2 \quad (6)$$

where each of $\phi_{1st}(t_i)$, $\phi_{3rd}(t_i)$, and $\phi_{1stXY}(t_i)$ is a function for estimating (calculating) optical characteristics of the projection optical system based on time and an exposure amount of a substrate. That is, $\phi_{1st}(t_i)$ represents the estimated value of a generation amount of the first-order distortion symmetrical component at the time $t_i$, $\phi_{3rd}(t_i)$ represents the estimated value of a generation amount of the third-order distortion symmetrical component at the time $t_i$. In addition, $\phi_{1stXY}(t_i)$ represents the estimated value of a generation amount of the XY difference component of the first-order distortion at the time $t_i$. $\phi_{1st}(t_i)$, $\phi_{3rd}(t_i)$, and $\phi_{1stXY}(t_i)$ are given by:

$$\phi_{1st} = E \cdot \left(1 - \exp\left(-\frac{t}{K_{1st}}\right)\right) + \phi_{k-1} \exp\left(-\frac{t}{K_{1st}}\right) \quad (7)$$

$$\phi_{3st} = E \cdot \left(1 - \exp\left(-\frac{t}{K_{3st}}\right)\right) + \phi_{k-1} \exp\left(-\frac{t}{K_{3st}}\right)$$

$$\phi_{1stXY} = E \cdot \left(1 - \exp\left(-\frac{t}{K_{1stXY}}\right)\right) + \phi_{k-1} \exp\left(-\frac{t}{K_{1stXY}}\right)$$

where "t" represents time, and "$K_{1st}$", "$K_{3rd}$", and "$K_{1stXY}$" represent time constants of respective distortion components.

By using the least square method or the like, the controller 7 obtains a coefficient $Ic_{1st}$, a coefficient $Ic_{3rd}$, and a coefficient $Ic_{1stXY}$ such that the square sum of differences between a deviation amount of an actually measured image point position, and the deviation amounts $dx(x_i, y_i, t_i)$ and $dy(x_i, y_i, t_i)$ of the image point position represented by formulas (6) is minimized. By thus representing the deviation amounts at the image point position as in formulas (6), it becomes possible to perform measurement of the image point position at arbitrary time and arbitrary measurement coordinates. It is therefore possible to sample measurement points freely in terms of space/time and perform measurement of the image point position.

[Grouping of Measurement Points]

Measurement of image point positions is performed after the end of an exposure step within a period when a change amount of optical characteristics of the projection optical system generated in the exposure step decreases. In this case, the change amount of the optical characteristics of the projection optical system 3 shows a tendency to be the largest immediately after the end of the exposure step, decrease as a time has elapsed from the end of the exposure step, and almost run out eventually, as shown in FIG. 2. It is therefore preferable that measurement of the image point position is performed in a state in which the change amount of the optical characteristics of the projection optical system is large as much as possible in order to sufficiently optimize a prediction formula for predicting the optical characteristics of the projection optical system 3. Measurement of the image point positions is preferably performed, for example, within a target period when the change amount of the optical characteristics of the projection optical system becomes 50% or higher (more preferably, 70% or higher) relative to a change amount in a saturated state.

It may become difficult, however, to perform measurement of image point positions at a plurality of measurement points within the target period if the number of measurement points at which the image point positions are to be measured is large, for example, in a case in which a prediction formula of a higher-order distortion component is determined as in this embodiment or the like. To cope with this, the controller 7 distributes the plurality of measurement points in the information acquired in step S11 to a plurality of groups each including at least one measurement point. Then, the controller 7 performs measurement of an image point position at each measurement point in one group (measurement step) between exposure steps over a plurality of times such that the measurement steps and the exposure steps are performed alternately.

FIGS. 7A to 7C are views showing an example in which the plurality (twelve) of measurement points 21 shown in FIG. 6 are distributed to three groups. The four measurement points 21 arranged at respective apexes of the projection region 20 are distributed to the first group shown in FIG. 7A. The four measurement points 21 arranged at respective sides of the projection region 20 are distributed to the second group shown in FIG. 7B. Furthermore, the four measurement points 21 arranged inside the projection region 20 are distributed to the third group shown in FIG. 7C. The measurement points 21 are preferably distributed to a plurality of groups in accordance with a time constant K (that is, a change speed of the optical characteristics) of the projection optical system 3, a time required to measure an image point position at one measurement point, or the like such that measurement of image point positions in one group is performed within a target period.

Figure 8:
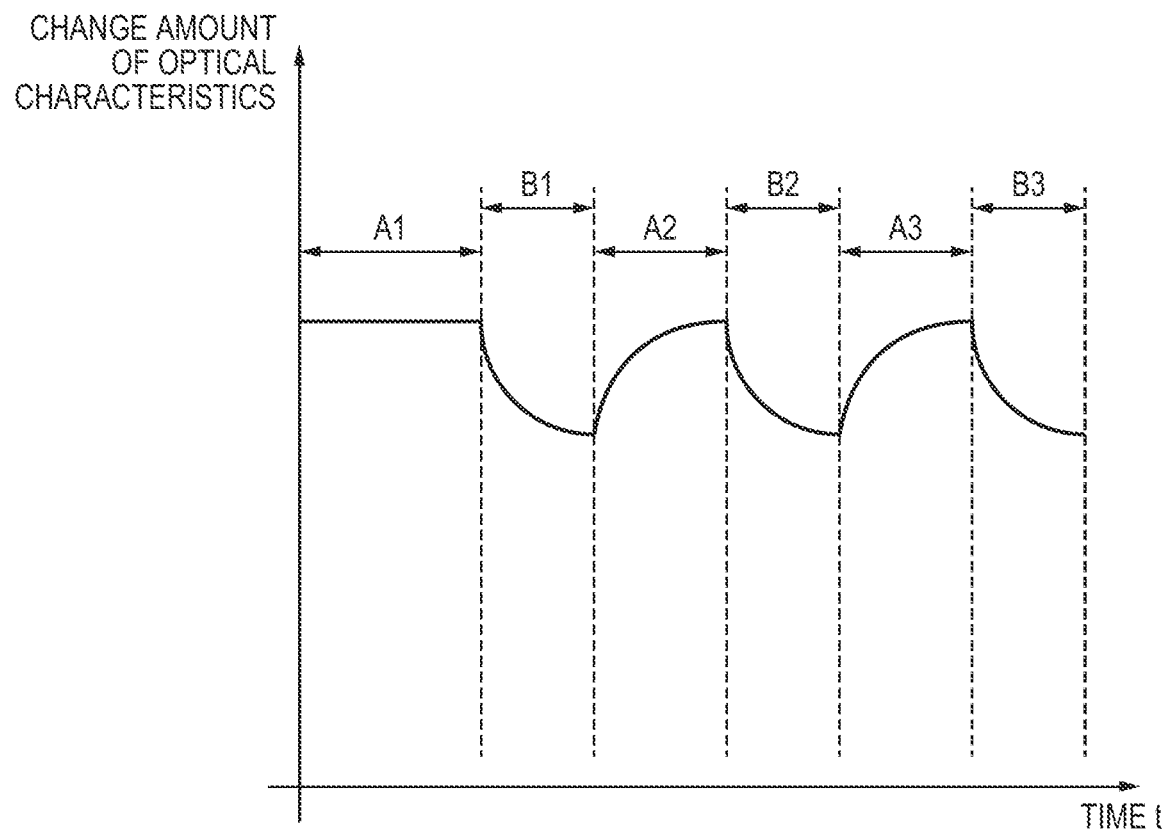
FIG. 8 is a graph showing a change amount of optical characteristics of a projection optical system in a case in which a measurement step is performed for each group between exposure steps.

FIG. 8 is a graph showing a change amount ($Ic \cdot E_k$) of the optical characteristics of the projection optical system 3 in a case in which exposure steps and measurement steps are performed alternately (in a case in which the measurement step between the exposure steps is performed for each group). In the example shown in FIGS. 7A to 7C, a measurement step B1 for the first group is performed after the end of an exposure step A1, and an exposure step A2 is performed after the end of the measurement step B1 for the first group. Moreover, a measurement step B2 for the second group is performed after the end of the exposure step A2, an exposure step A3 is performed after the end of the measurement step B2 for the second group, and a measurement step B3 for the third group is performed after the end of the exposure step A3. That is, in an example shown in FIG. 8, the exposure steps and the measurement steps can be performed alternately, and the exposure steps can be performed between the measurement step B1 for the first group and the measurement step B2 for the second group and between the measurement step B2 for the second group and the measurement step B3 for the third group.

Figure 9:
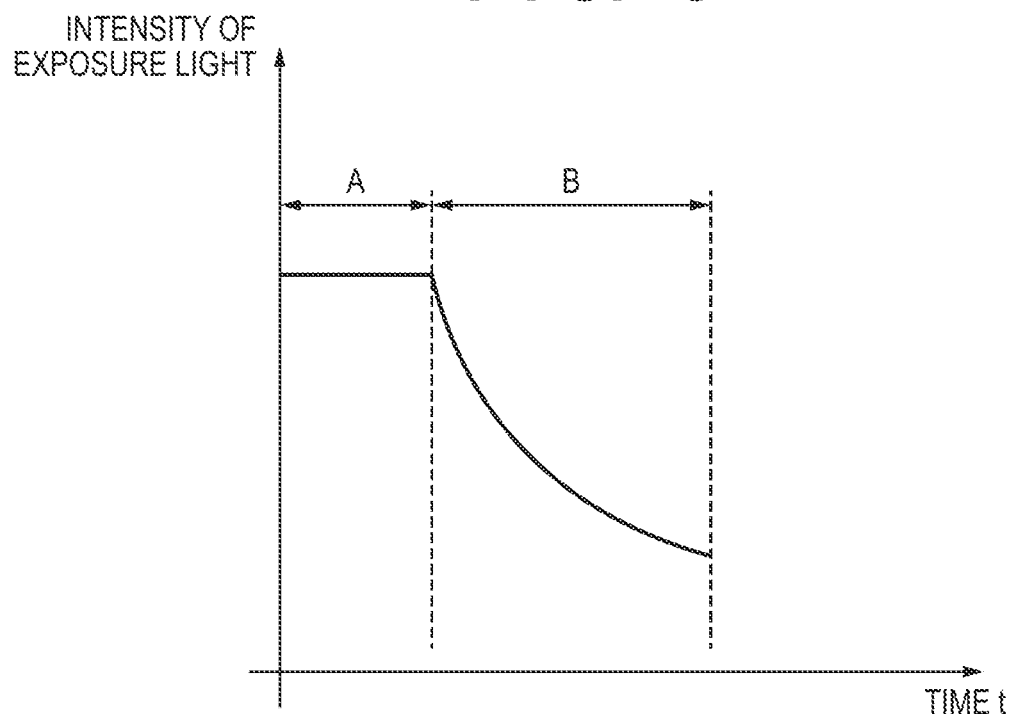
FIG. 9 is a graph showing a change amount of the optical characteristics of the projection optical system in a case in which measurement is performed at all measurement points after an exposure step.

By thus distributing the plurality of measurement points to the plurality of groups, and performing the measurement step for one group and the exposure step alternately, it is possible to perform measurement of the image point position at each measurement point in a state in which the change amount of the optical characteristics of the projection optical system 3 is comparatively large. On the other hand, as shown in FIG. 9, if measurement of the image point positions is performed continuously at all (twelve) the measurement points in a period after the exposure step, it may become necessary to perform measurement even in a state in which the change amount of the optical characteristics of the projection optical system 3 is close to zero. This may make it difficult to optimize a prediction formula accurately.

[Effect]

An effect of grouping and measuring the plurality of measurement points as described above will be described here quantitatively. In the following description, assume that the time constant K of the projection optical system for each of the first-order distortion, the third-order distortion, and the XY difference component of the first-order distortion is 80 sec, and a time required to measure an image point position at one measurement point is 10 sec.

For example, as shown in FIG. 9, assume a case in which a measurement step B is started in a state in which the optical characteristics of the projection optical system 3 are saturated immediately after the end of an exposure step A, and measurement of the image point positions for all the twelve measurement points is performed continuously. In this case, a total time required to measure all the measurement points is 120 sec. As described above, since an exposure amount $E_k$ is in a state close to "zero" during measurement of the image point positions, the change amount of the optical characteristics of the projection optical system 3 decreases exponentially along with the elapse of time. Accordingly, optical characteristics when measurement of all the measurement points is ended decrease up to $\exp(-t/K) = \exp(-120/80) \approx 22\%$ as compared with optical characteristics at the start of measurement. Furthermore, optical characteristics at intermediate time (60 sec) in the measurement step decrease up to $\exp(-60/80) = 47\%$.

Consider a generation amount of an exposure aberration (optical characteristics of the projection optical system 3) at the start of measurement (immediately after the end of exposure), that is, the measurement accuracy of the saturation value $Ic \cdot E_k$. Assuming that a measurement accuracy in a case in which the optical characteristics of the projection optical system do not change is 1.0 ppm, a measurement accuracy in a case in which measurement is performed at the intermediate time of the measurement step in which the optical characteristics decrease up to 47% is estimated to be 2.1 ppm.

On the other hand, as shown in FIG. 8, in a case in which twelve measurement points are distributed to three groups, and the measurement steps and the exposure steps are performed alternately, a total time required to measure the respective measurement points in one group is 40 sec. That is, optical characteristics when measurement at the respective measurement points in one group ends decrease only $\exp(-40/80) = 61\%$ and $\exp(-20/80) = 78\%$ at intermediate time (20 sec). Then, a measurement accuracy in a case in which measurement is performed at the intermediate time of the measurement step is estimated to be 1.3 ppm, and it is found that the measurement accuracy improves as compared with a case in which measurement is performed continuously at all the measurement points as shown in FIG. 9.

As described above, in this embodiment, the plurality of measurement points are distributed to the plurality of groups, and the measurement step for each group is performed between the exposure steps. This makes it possible to perform measurement of the image point positions at the respective measurement points within the target period. It is therefore possible to predict the optical characteristics of the projection optical system 3 during exposure of a substrate accurately by using a prediction formula determined based on this measurement result.

Embodiment of Method of Manufacturing Article

A method of manufacturing an article according to an embodiment of the present invention is suitable for manufacturing the article, for example, a microdevice such as a semiconductor device or an element having a fine structure. The method of manufacturing the article according to this embodiment includes a step of forming, using the above-described exposure apparatus, a latent image pattern on a photoresist applied to a substrate (a step of exposing a substrate) and a step of developing the substrate with the latent image pattern formed in the above step, and the article is manufactured from the developed substrate. The manufacturing method also includes other known steps (for example, oxidation, deposition, vapor deposition, doping, planarization, etching, resist removal, dicing, bonding, and packaging). The method of manufacturing the article according to this embodiment is advantageous in at least one of the performance, quality, productivity, and production cost of the article, as compared to conventional methods.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-181472 filed on Sep. 21, 2017, which is hereby incorporated by reference herein in its entirety.

What is claimed is:

1. An adjusting method of adjusting an optical characteristic of a projection optical system that changes due to heat during exposure of a substrate, the method comprising:
measuring respective image point positions at different measurement timings for a plurality of measurement points located on an object plane of the projection optical system;
estimating deviation amounts of the respective image point positions for the plurality of measurement points using the different measurement timings for the respective measurement points, each deviation amount being changed by the different measurement timing for the respective measurement point;
calculating the optical characteristic based on the measured respective image point positions and the estimated deviation amounts; and
adjusting the optical characteristic of the projection optical system based on the calculated optical characteristic.

2. The method according to claim 1, wherein the estimating estimates each deviation amount using a time function for estimating the respective image point position.

3. The method according to claim 2, wherein the time function includes, as parameters, an amount of light transmitted through the projection optical system and a time constant of the projection optical system.

4. The method according to claim 1, wherein the measuring is performed within a period in which the optical characteristic changes.

5. The method according to claim 4, further comprising:
exposing the substrate via the projection optical system, wherein the measuring is performed, after the exposing of the substrate, within a period in which a change amount of the optical characteristic generated in the exposing decreases.

6. The method according to claim 5, wherein:
the plurality of measurement points are distributed to a plurality of groups that include a first group and a second group, and
the exposing is performed before the measuring for the second group and after the measuring for the first group.

7. The method according to claim 1, wherein the measuring is performed in a state where an amount of light transmitted through the projection optical system is smaller than that during exposure of the substrate.

8. The method according to claim 1, wherein the calculating calculates a magnification component of the projection optical system as the optical characteristic.

9. The method according to claim 1, wherein the respective measurement points are located at different positions from each other on the object plane of the projection optical system.

10. The method according to claim 1, wherein the calculating:
determines a prediction formula for predicting the optical characteristic of the projection optical system based on the measured respective image point positions and the estimated-deviation amounts; and
calculates the optical characteristic using the determined prediction formula.

11. An exposure method of exposing a substrate, the method comprising:
calculating, using a calculation method, an optical characteristic of a projection optical system that changes due to heat during exposure of a substrate; and
exposing the substrate via the projection optical system after adjusting the optical characteristic of the projection optical system based on the calculated optical characteristic, wherein the calculation method comprises:
  measuring respective image point positions at different measurement timings for a plurality of measurement points located on an object plane of the projection optical system;
  estimating deviation amounts of the respective image point positions for the plurality of measurement points using the different measurement timings for the respective measurement points, each deviation amount being changed by the different measurement timing for the respective measurement point; and
  calculating the optical characteristic based on the measured respective image point positions and the estimated deviation amounts.

12. A non-transitory computer-readable storage medium storing a program executable by a computer to execute each step of a calculation method of calculating an optical characteristic of a projection optical system that changes due to heat during exposure of a substrate, the method comprising:
  measuring respective image point positions at different measurement timings for a plurality of measurement points located on an object plane of the projection optical system;
  estimating deviation amounts of the respective image point positions for the plurality of measurement points using the different measurement timings for the respective measurement points, each deviation amount being changed by the different measurement timing for the respective measurement point; and
  calculating the optical characteristic based on the measured respective image point positions and the deviation amounts.

13. An exposure apparatus for exposing a substrate via a projection optical system, the apparatus comprising:
  a sensor configured to measure an image point position of the projection optical system;
  a mechanism configured to change an optical characteristic of the projection optical system; and
  a controller configured to control the mechanism, wherein the controller:
  causes the sensor to measure respective image point positions at different measurement timings for a plurality of measurement points located on an object plane of the projection optical system;
  estimates deviation amounts of the respective image point positions for the plurality of measurement points using the different measurement timings for the respective measurement points, each deviation amount being changed by the different measurement timing for the respective measurement point;
  calculates the optical characteristic based on the measured respective image point positions and the estimated deviation amounts; and
  controls the mechanism based on the calculated optical characteristic.

14. A method of manufacturing an article, the method comprising:
  exposing a substrate using an exposure apparatus;
  developing the exposed substrate; and
  processing the developed substrate to manufacture the article,
  wherein the exposure apparatus exposes the substrate via a projection optical system, and includes:
    a sensor configured to measure an image point position of the projection optical system;
    a mechanism configured to change an optical characteristic of the projection optical system; and
    a controller configured to control the mechanism, wherein the controller:
    causes the sensor to measure respective image point positions at different measurement timings for a plurality of measurement points located on an object plane of the projection optical system;
    estimates deviation amounts of the respective image point positions for the plurality of measurement points using the different measurement timings for the respective measurement points, each deviation amount being changed by the different measurement timing for the respective measurement point;
    calculates the optical characteristic based on the measured respective image point positions and the deviation amounts; and
    controls the mechanism based on the calculated optical characteristic.

* * * * *